(12) United States Patent
Schemm (10) Patent No.: US 11,698,307 B2
(45) Date of Patent: Jul. 11, 2023

(54) METHODS AND APPARATUS TO TRIM TEMPERATURE SENSORS

(71) Applicant: Texas Instruments Incorporated, Dallas, TX (US)

(72) Inventor: Nathan Richard Schemm, Rowlett, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 591 days.

(21) Appl. No.: 16/731,910

(22) Filed: Dec. 31, 2019

(65) Prior Publication Data

US 2021/0199515 A1    Jul. 1, 2021

Related U.S. Application Data

(60) Provisional application No. 62/955,564, filed on Dec. 31, 2019.

(51) Int. Cl.
*G01K 7/16* (2006.01)
*G01K 15/00* (2006.01)
*G05B 11/01* (2006.01)
*H01L 23/34* (2006.01)

(52) U.S. Cl.
CPC ............ *G01K 15/005* (2013.01); *G01K 7/16* (2013.01); *G01K 15/007* (2013.01); *G05B 11/018* (2013.01); *H01L 23/34* (2013.01)

(58) Field of Classification Search
CPC ...... G01K 15/005; G01K 7/16; G01K 15/007; G01B 11/018; H01L 23/34
USPC .............. 374/1, 170, 178, 185; 702/99
See application file for complete search history.

(56) References Cited

U.S. PATENT DOCUMENTS

| | | | |
|---|---|---|---|
| 9,711,487 B2* | 7/2017 | Park | H01L 25/18 |
| 11,121,679 B2* | 9/2021 | Jang | H03F 3/72 |
| 11,125,628 B2* | 9/2021 | Takeuchi | G01R 31/3004 |
| 2008/0069176 A1* | 3/2008 | Pertijs | G01K 15/005 374/170 |
| 2014/0341257 A1* | 11/2014 | Bernardinis | G01D 5/2454 374/178 |
| 2015/0177075 A1* | 6/2015 | Coimbra | G01R 31/2874 374/163 |
| 2016/0313755 A1* | 10/2016 | Patti | G05F 5/00 |
| 2021/0055166 A1* | 2/2021 | Wang | G01K 7/24 |

FOREIGN PATENT DOCUMENTS

| | | | |
|---|---|---|---|
| CN | 114705325 A1 * | 7/2022 | |
| CN | 115483894 A * | 12/2022 | H03F 1/32 |

\* cited by examiner

*Primary Examiner* — Gail Kaplan Verbitsky
(74) *Attorney, Agent, or Firm* — Charles F. Koch; Frank D. Cimino (57) ABSTRACT

Methods, apparatus, systems and articles of manufacture to trim temperature sensors are disclosed. An example method includes: sampling a first value indicative of a temperature of a first die of a multi-chip module (MCM) with a first temperature sensor, the first die including a first transistor having a channel including a first material; and calibrating a second temperature sensor configured to sample a second value indicative of a temperature of a second die including a second transistor have a second channel including a second material, the calibrating based on the first value.

7 Claims, 5 Drawing Sheets

METHODS AND APPARATUS TO TRIM TEMPERATURE SENSORS

RELATED APPLICATION

This patent arises from an application claiming benefit of U.S. Provisional Patent Application Ser. No. 62/955,564, which was filed on Dec. 31, 2019. U.S. Provisional Patent Application Ser. No. 62/955,564 is hereby incorporated herein by reference in its entirety. Priority to U.S. Provisional Patent Application Ser. No. 62/955,564 is hereby claimed.

FIELD OF THE DISCLOSURE

This disclosure relates generally to multi-chip modules, and, more particularly, to methods and apparatus to trim temperature sensors.

BACKGROUND

Multi-chip modules improve performance and reduce costs of products requiring integrated circuits. Multi-chip modules consist of multiple integrated circuits and allow for more integrated circuits in a smaller area, which produces improved results over using singular integrated circuits.

DETAILED DESCRIPTION

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor first may be used to refer to an element in the detailed description, while the same element may be referred to in a claim with a different descriptor such as second or third As used herein, the term above is used with reference to a bulk region of a base semiconductor substrate (e.g., a semiconductor wafer) on which components of an integrated circuit are formed. Specifically, as used herein, a first component of an integrated circuit is above a second component when the first component is farther away from the bulk region of the semiconductor substrate than the second component. Likewise, as used herein, a first component is below another component when the first component is closer to the bulk region of the semiconductor substrate than the second component. As noted above, one component can be above or below another with other components therebetween or while being in direct contact with one another.

Integrated circuits are sets of electronic circuits used in the majority of electronics. Multi-chip modules (MCMs) include multiple integrated circuits, semiconductor dies, and/or other discrete components implemented on one or more die in a package. As used herein, the terms integrated circuits, integrated circuit dies, dies, etc. refer to integrated circuits, semiconductor dies, and/or other discrete components included in a package. Placing multiple integrated circuit dies onto one MCM (e.g., in a package) allows for more power and efficiency within a smaller area. The integrated circuit dies of an MCM can consist of several different materials, including silicon (Si) and gallium nitride (GaN). The integrated circuit die material determines the properties of the integrated circuit die.

Manufacturers and users of MCMs often need to know the temperature of various integrated circuit dies of the MCM. In some compositions of integrated circuit dies, it is advantageous and/or otherwise possible to include a temperature sensor onto the integrated circuit die and do any pre-programming (e.g., trimming, calibrating, calibrating before combining integrated circuit die in a package, etc.) of the sensor before the integrated circuit die is combined with the MCM. However, with some compositions of integrated circuit dies (e.g., GaN), it may be challenging to include a temperature sensor with sufficient accuracy (e.g., within a threshold of accuracy) directly on the integrated circuit die.

When pre-programming (e.g., e.g., calibrating, calibrating before combining integrated circuit die in a package, etc.) is challenging, other techniques to integrate, test, and calibrate temperature sensors of an MCM can be used. However, such techniques present their own problems. For example, integrated circuit dies including compositions for which it is challenging to pre-program lack sufficient functionality to host memory including instructions to calibrate (e.g., trim) the temperature sensor. Additionally, the temperature measured using other techniques includes error that prevents accurate measurement of temperature. For example, because different integrated circuit dies can operate at different temperatures, the temperature determined on one integrated circuit die and/or determined based on a measurement conducted on a package including multiple integrated circuit die (e.g., an MCM) is not reliable for other integrated circuit die in an MCM. Thus, temperature sensors of other techniques can be highly inaccurate and even provide false measurements regarding the temperature of an integrated circuit die under test.

Figure 1:
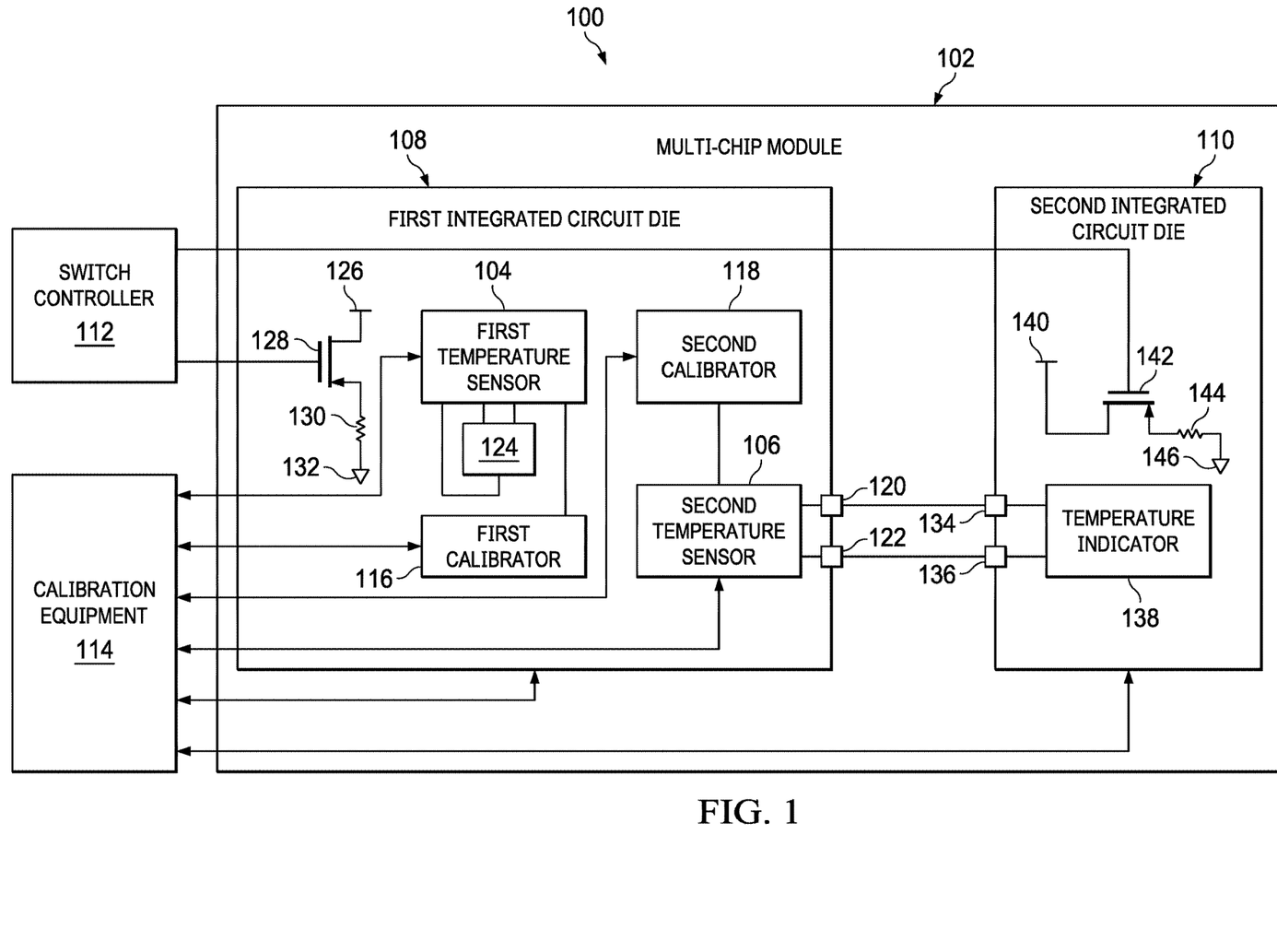
FIG. 1 is an illustration of an example environment including a multi-chip module with a first temperature sensor and a second temperature sensor associated with a first integrated circuit die and a second integrated circuit die, respectively.

FIG. 1 is an illustration of an example environment 100 including a multi-chip module 102 with a first temperature sensor 104 and a second temperature sensor 106 associated with a first integrated circuit die 108 and a second integrated circuit die 110, respectively. The environment 100 includes the example multi-chip module (MCM) 102 the example first integrated circuit die 108, the example second integrated circuit die 110, an example switch controller 112, and example calibration equipment 114. The MCM 102 includes a package that includes the first and second integrated circuit dies 108, 110. The example first integrated circuit die 108 includes the first temperature sensor 104, the second temperature sensor 106, a first calibrator 116, a second calibrator 118, a first terminal 120, a second terminal 122, a first temperature indicator 124, a first voltage supply node 126, a first switch 128, a first resistor 130, and a first reference voltage node 132. The example second integrated circuit die 110 includes a first terminal 134, a second terminal 136, a second temperature indicator 138, a second voltage supply node 140, a second switch 142, a second resistor 144, and a second reference voltage node 146.

In the example of FIG. 1, the first integrated circuit die 108 is coupled to the second integrated circuit die 110 via the first terminal 120 and the second terminal 122. For example, the first terminal 120 of the first integrated circuit die 108 can be coupled to the first terminal 134 of the second integrated circuit die 110 and the second terminal 122 of the first integrated circuit die 108 can be coupled to the second terminal 136 of the second integrated circuit die 110. In the illustrated example of FIG. 1, the first integrated circuit die 108 includes the first temperature sensor 104, the second temperature sensor 106, the first calibrator 116, the second calibrator 118, the first terminal 120, the second terminal 122, the first temperature indicator 124, the first voltage supply node 126, the first switch 128, the first resistor 130, and the first reference voltage node 132. The first temperature sensor 104 is coupled to the first calibrator 116 and the first temperature indicator 124. The second temperature sensor 106 is coupled to the second calibrator 118, the first terminal 120 of the first integrated circuit die 108, and the second terminal 122 of the first integrated circuit die 108. The first switch 128 is coupled to the first voltage supply node 126, the switch controller 112, and the first resistor 130. The first resistor 130 is coupled between the first switch 128 and the first reference voltage node 132.

In the example of FIG. 1, the second integrated circuit die 110 includes the first terminal 134, the second terminal 136, the second temperature indicator 138, the second voltage supply node 140, the second switch 142, the second resistor 144, and the second reference voltage node 146. The second temperature indicator 138 is coupled to the first terminal 134 of the second integrated circuit die 110 and the second terminal 136 of the second integrated circuit die 110. The second switch 142 is coupled to the second voltage supply node 140, the switch controller 112, and the second resistor 144. The second resistor 144 is coupled between the second switch 142 and the second reference voltage node 146.

In the illustrated example of FIG. 1, the first terminal 120 of the first integrated circuit die 108 is coupled to first terminal 134 of the second integrated circuit die 110 and the second terminal 122 of the first integrated circuit die 108 is coupled to the second terminal 136 of the second integrated circuit die 110. The first integrated circuit die 108 can be coupled to the second integrated circuit die 110 via, for example, bond wires in the MCM 102. For example, the bond wires can couple the second temperature sensor 106 to the second temperature indicator 138. The coupling between the second temperature sensor 106 and the second temperature indicator 138 of the second integrated circuit die 110 allows the second temperature sensor 106 to measure (e.g., sample) the temperature (e.g., via the a voltage and/or resistance value associated with the second temperature indicator 138) of the second integrated circuit die 110 (e.g., components of the second integrated circuit die 110, the second switch 142, etc.). Additionally, the coupling between the second temperature sensor 106 and the second temperature indicator 138 of the second integrated circuit die 110 allows the second temperature sensor 106 to be calibrated with the second calibrator 118 and increase the accuracy of the second temperature sensor 106.

In the example illustrated in FIG. 1, the first integrated circuit die 108 can be formed on/formed by a semiconductor die. The first integrated circuit die 108 can be constructed on a wafer including one or more integrated circuit dies similar to the first integrated circuit die 108. In the example of FIG. 1, the first integrated circuit die 108 is a Si integrated circuit die. The first temperature sensor 104 provides a user or a manufacturer with an accurate reading of the temperature of the first integrated circuit die 108 (e.g., components of the first integrated circuit die 108, the first switch 128, etc.). The first temperature sensor 104 can include an amplifier, one or more current mirrors, and/or other circuit components to facilitate measurement of temperature (e.g., sampling of temperature) via the first temperature indicator 124. The first temperature indicator 124 can include two forward-biased P-N junctions (e.g., two forward-biased diodes, two forward biased bipolar junction transistors, etc.). For example, a temperature sensor including two forward-biased P-N junctions operating at the same and/or similar temperature but with different current densities allows for a proportional relationship between the temperature and current. This proportional relationship includes little variation due to other effects that would cause inaccuracy. In some examples, the first temperature indicator 124 can indicate a temperature of the first switch 128. In the example of FIG. 1, the first switch 128 is a positive-channel (e.g., p-channel) metal-oxide-semiconductor field-effect transistor (MOSFET) having a channel including silicon. In additionally or alternative examples, the first switch 128 can be implemented by any number of transistors (e.g., bipolar junction transistors (BJTs), junction gate field-effect-transistors (JFETs), negative channel (n-channel) MOSFETs, insulated gate bipolar transistor (IGBT), etc.). The first resistor 130 is representative of a load (e.g., an electronic component, a portion of a circuit, etc.). In FIG. 1, the example first switch 128 controls the flow of current between the first voltage supply node 126 and the first resistor 130.

In the example illustrated in FIG. 1, the first calibrator 116 can include a variable resistance that can be calibrated and/or trimmed (e.g., by the calibration equipment 114) to increase the accuracy of the first temperature sensor 104. For example, altering and/or otherwise calibrating (e.g., trimming) the resistance can alter and/or otherwise change the gain of the first temperature sensor 104. By altering the gain of the first temperature sensor 104 with the first calibrator 116, the accuracy of the first temperature sensor 104 can be increased to meet a threshold of accuracy of temperature measurements (e.g., sample of temperature, samples of values indicative of temperature, etc.) of the first integrated circuit die 108.

In the example of FIG. 1, the MCM 102 includes the second integrated circuit die 110. The second integrated circuit die 110 can be formed on/formed by a semiconductor die. In the example of FIG. 1, the second integrated circuit die 110 is a GaN integrated circuit die. In some examples, the second integrated circuit die 110 can be a Si integrated circuit die. The second integrated circuit die 110 includes the first terminal 134 and the second terminal 136 which couple the second temperature indicator 138 of the second integrated circuit die 110 to the second temperature sensor 106 of the first integrated circuit die 108. The second temperature indicator 138 can be implemented by a temperature-coefficient resistor where the voltage across the temperature-coefficient resistor is indicative of the temperature of the second integrated circuit die 110. The second temperature sensor 106 and/or the second calibrator 118 can induce a current through the temperature-coefficient resistor to measure (e.g., sample) the voltage of the temperature-coefficient resistor.

In the example illustrated in FIG. 1, the second temperature sensor 106 can measure (e.g., is configured to measure, configured to sample, etc.) the temperature of the second integrated circuit die 110 (e.g., components of the second integrated circuit die 110, the second switch 142, etc.). For example, the second temperature sensor 106 provides a user with an accurate reading of the temperature of the second integrated circuit die 110 by measuring the second temperature indicator 138. In some examples, the second temperature indicator 138 can indicate a temperature of the second switch 142. In the example of FIG. 1, the second switch 142 is a p-channel MOSFET having a channel including gallium nitride. In additional or alternative examples, the second switch 142 can be implemented by any suitable transistor including a channel material in Groups III-V of the periodic table of elements. In additionally or alternative examples, the second switch 142 can be implemented by any number of transistors (e.g., BJTs, JFETs, n-channel MOSFETs, IGBT, etc.). The second resistor 144 is representative of a load (e.g., an electronic component, a portion of a circuit, etc.). In some examples, the second resistor 144 can represent a part of an electric vehicle (e.g., a motor, a battery, etc.). In FIG. 1, the example second switch 142 controls the flow of current between the second voltage supply node 140 and the second resistor 144. The second calibrator 118 can include a current source to induce a voltage across the temperature-coefficient resistor (e.g., the second temperature indicator 138). The second calibrator 118 can be used (e.g., by the calibration equipment 114) to calibrate the current of a current source in the second calibrator 118 based on the temperature reading of the first temperature sensor 104. Based on the temperature measurement (e.g., the sample of a value indicative of the temperature) of the first temperature sensor 104, the second temperature sensor 106 can be calibrated to increase the accuracy of the second temperature sensor 106. The second temperature sensor 106 and/or the second calibrator 118 can be used in situations where it is challenging to include a temperature sensor on the second integrated circuit die 110. For example, in such situations, the second temperature sensor 106 and/or the second calibrator 118 facilitate measurement of the temperature (e.g., sampling of a value indicative of the temperature) of the second integrated circuit die 110 (e.g., components of the second integrated circuit die 110, the second switch 142, etc.).

In the example FIG. 1, the switch controller 112 controls the operation of the first switch 128 and/or the second switch 142. In some examples, the switch controller 112 can be implemented by a microcontroller, a gated driver, dedicated logic, and/or any other suitable circuitry. In the example illustrated in FIG. 1, the calibration equipment 114 can include a mechanical apparatus (e.g., a robotic arm, a pick-and-place machine, automated test equipment, etc.) configured to pick, place, and/or otherwise manipulate the mechanical orientation and/or connections of the MCM 102, the first integrated circuit die 108, and/or the second integrated circuit die 110. Additionally or in the alternative, the calibration equipment 114 may include a control computer at a test station, a processor platform, a personal computing device, or any other suitable device for the application that is configured to adjust the first calibrator 116 and/or the second calibrator 118. For example, the calibration equipment 114 can be configured to carry out a first construction phase, a first testing phase, a second testing phase, and/or a second construction phase, as described herein. In some examples, the calibration equipment 114 can be referred to as an external device and/or an adjustment device.

In some examples, the calibration equipment 114 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). The calibration equipment 114 is configured to calibrate the first temperature sensor 104 with the first calibrator 116. For example, the calibration equipment 114 can calibrate the first temperature sensor 104 using the first calibrator 116 during the first testing phase.

In the example of FIG. 1, during the first construction phase and/or the second construction phase, the calibration equipment 114 can assemble the MCM 102 including the first integrated circuit die 108 and the second integrated circuit die 110. For example, during the first construction phase, one or more of the first integrated circuit die 108 can be fabricated on a wafer (e.g., a silicon wafer). Furthermore, during the first construction phase, one or more of the first integrated circuit die 108 (e.g., including the first temperature sensor 104 and the second temperature sensor 106) can be cut from the wafer (e.g., via die cutting and/or wafer dicing) (e.g., by the calibration equipment 114). During the first construction phase, the first temperature sensor 104 and the second temperature sensor 106 can be fixed to and/or fabricated upon the first integrated circuit die 108 (e.g., by the calibration equipment 114). Additionally, during the first construction phase, the second temperature sensor 106 can be combined with the first integrated circuit die 108.

In the example of FIG. 1, during the first testing phase (e.g., after the first temperature sensor 104 has been combined and/or otherwise coupled to the first integrated circuit die 108), the first temperature sensor 104 can be calibrated using the first calibrator 116 (e.g., by the calibration equipment 114). The first temperature sensor 104 can be calibrated based on the temperature of the first integrated circuit die 108 to meet a threshold of accuracy. During the first testing phase (e.g., while the first integrated circuit die 108 is on a wafer), the first temperature sensor 104 can be calibrated with the first calibrator 116. The first temperature sensor 104 can be calibrated with the first calibrator 116 to meet a threshold of accuracy for measurements of the temperature of the first integrated circuit die 108 (e.g., components of the first integrated circuit die 108, the first switch 128, etc.).

In the example illustrated in FIG. 1, during the second construction phase, the first integrated circuit die 108 can be combined with the MCM 102. During the second construction phase, the second integrated circuit die 110 fabricated from a semiconductor material (e.g., silicon, gallium nitride, etc.) can be combined with the MCM 102. During the second construction phase, the second temperature sensor 106 can be coupled to the second temperature indicator 138, and/or, more generally, the second integrated circuit die 110.

In the example of FIG. 1, after the second construction phase, the second calibrator 118 can be used (e.g., by the calibration equipment 114) to calibrate the second temperature sensor 106 during the second testing phase. For example, during the second testing phase, the calibration equipment 114 can measure (e.g., is configured to measure, sample, etc.) the temperature of the MCM 102 using the first temperature sensor 104. Additionally, during the second testing phase, the calibration equipment 114 can calibrate the second temperature sensor 106 using the second calibrator 118 based on the temperature measured using the first temperature sensor 104. For example, the temperature determined by the first temperature sensor 104 can be used (e.g., by the calibration equipment 114) to calibrate the second temperature sensor 106 with the second calibrator 118. During the second testing phase, the calibration equipment 114 can determine whether to calibrate the second temperature sensor 106 at any additional temperatures (e.g., at expected operational temperatures, at expected high-temperature operating conditions, etc.). The second calibrator 118 can calibrate and/or can be used to calibrate the second temperature sensor 106 to increase the accuracy with which the second temperature sensor 106 measures (e.g., samples a value indicative of) the temperature of the second integrated circuit die 110. In the illustrated example of FIG. 1, the second calibrator 118 can calibrate and/or can be used to calibrate the second temperature sensor 106 to meet a threshold of accuracy for temperature measurements of the second integrated circuit die 110. After the second testing phase, the calibration equipment 114 can forward the MCM 102 to a next stage of production (e.g., packaging, distribution, etc.).

Figure 2:
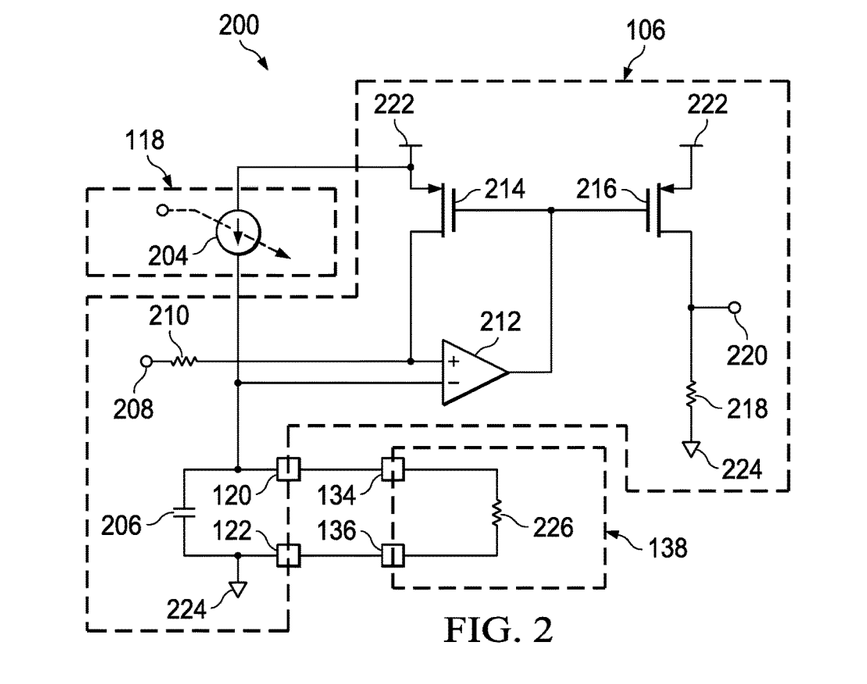
FIG. 2 is a schematic illustration of an example circuit representative of the example second temperature sensor, the example second calibrator, and the example second temperature indicator.

FIG. 2 is a schematic illustration of an example circuit 200 representative of the example second temperature sensor 106, the example second calibrator 118, and the example second temperature indicator 138. The example second calibrator 118 includes an example current source 204. The example second temperature sensor 106 includes the example first terminal 120 of the first integrated circuit die 108 and the example second terminal 122 of the first integrated circuit die 108. The example second temperature indicator 138 includes the example first terminal 134 of the second integrated circuit die 110 and the example second terminal 136 of the second integrated circuit die 110. The example second temperature sensor 106 additionally includes an example capacitor 206, an example third terminal 208, an example first resistor 210, an example amplifier 212, an example first transistor 214, and example second transistor 216, an example second resistor 218, an example fourth terminal 220, an example voltage supply node 222, and an example reference voltage node 224. The example second temperature indicator 138 additionally includes an example third resistor 226. In the example illustrated in FIG. 2, the second temperature sensor 106 and/or the second calibrator 118 can be formed on/formed by a material including silicon (e.g., the first integrated circuit die 108) and the second temperature indicator 138 can be formed on/formed by a material including gallium nitride (e.g., the second integrated circuit die 110).

In the example of FIG. 2, the example current source 204 is coupled to the voltage supply node 222, the first terminal 120, the capacitor 206, and an inverting terminal of the amplifier 212. The current source 204 can be calibrated and can be adjusted to improve the accuracy of temperature readings based on a voltage drop across the third resistor 226 and a threshold accuracy. Increased accuracy of temperature readings based on a voltage drop across the third resistor 226 reduces false positives when reading the temperature indicated by the second temperature indicator 138 and allows for a better understanding of the operating conditions of an integrated circuit die including the second temperature indicator 138 (e.g., the second integrated circuit die 110) and/or a switch having a channel including gallium nitride (e.g., the second switch 142).

In the illustrated example of FIG. 2, the current source 204 provides a current to the circuit dependent upon calibration operations that can be performed on the current source 204. The current source 204 can be calibrated and/or trimmed (e.g., by a technician, by a test apparatus, etc.) to provide a current value that increases, above a threshold of accuracy, the accuracy of temperature readings based on the voltage drop across the third resistor 226.

In the example illustrated in FIG. 2, the first terminal 120 of the first integrated circuit die 108 is coupled to the first terminal 134 of the second integrated circuit die 110. The second terminal 122 of the first integrated circuit die 108 is coupled to the second terminal 136 of the second integrated circuit die 110. The third resistor 226 causes a voltage drop between the first terminal 120 and the second terminal 122 that is dependent upon the temperature indicated by the second temperature indicator 138. Temperature readings based on the voltage between the first terminal 120 and the second terminal 122 allow for an understanding of the operating conditions of an integrated circuit die including the second temperature indicator 138 (e.g., the second integrated circuit die 110) and/or a switch having a channel including gallium nitride (e.g., the second switch 142).

In the illustrated example of FIG. 2, the capacitor 206 is coupled to the current source 204, the first terminal 120, the second terminal 122, the inverting terminal of the amplifier 212, and the reference voltage node 224. The capacitor 206 filters high frequency noise between the first terminal 120 and the second terminal 122. The capacitor 206 prevents frequent, rapid changes in the voltage drop between the first terminal 120 and the second terminal 122. Preventing noise from affecting the measurements of the voltage between the first terminal 120 and the second terminal 122 prevents temperature measurements based on the voltage between the first terminal 120 and the second terminal 122 from rapidly changing and allows for stable measurement of the temperature of an integrated circuit die including the second temperature indicator 138 (e.g., the second integrated circuit die 110) and/or the a switch having a channel including gallium nitride (e.g., the second switch 142).

In the example of FIG. 2, the third terminal 208 can receive an offset signal. In some examples, the third terminal 208 can be referred to as an offset voltage node. The voltage of the offset signal at the third terminal 208 can be adjusted depending on the application in which the second temperature sensor 106 is implemented. The first resistor 210 is coupled to the third terminal 208, the non-inverting terminal of the amplifier 212, and the first transistor 214. The first resistor 210 is an input resistance in the second temperature sensor 106. The first resistor 210 causes a voltage drop between the third terminal 208 and the non-inverting terminal of amplifier 212.

In the example illustrated in FIG. 2, the amplifier 212 includes a non-inverting input, an inverting input, and an output. The inverting input of the amplifier 212 is coupled to the current source 204, the first terminal 120, and the capacitor 206. The non-inverting terminal of the amplifier 212 is coupled to the first resistor 210 and the first transistor 214. The output of the amplifier 212 is coupled to the first transistor 214 and the second transistor 216.

In the illustrated example of FIG. 2, the amplifier 212 adjusts the voltage level at the output of the amplifier 212 to cause the voltage level at the non-inverting terminal of the amplifier 212 to be equal to (e.g., substantially equal to) the voltage level at the inverting terminal of the amplifier 212. In this manner, the first transistor 214 and the second transistor 216 can be adjusted to increase the level of current flowing through the first transistor 214 and the second transistor 216, respectively. Thus, a change in the level of current flowing through the first transistor 214 can be reflected in the level of current flowing through the second transistor 216.

In the example of FIG. 2, the first transistor 214 is a p-channel MOSFET (e.g., a positive-channel metal-oxide-semiconductor field-effect transistor). In other examples, the first transistor 214 can be implemented by any suitable switch, such as, a BJT, a JFET, etc. The first transistor 214 includes a gate (e.g., a control terminal), a drain (e.g., a current terminal), and a source (e.g., a current terminal). The gate of the first transistor 214 is coupled to the output of the amplifier 212 and the second transistor 216. The source of the first transistor 214 is coupled to the voltage supply node 222 and the drain of the first transistor 214 is coupled to the first resistor 210 and the non-inverting terminal of the amplifier 212. The first transistor 214 controls the flow of current between the voltage supply node 222 and the first resistor 210.

In the illustrated example of FIG. 2, the second transistor 216 is a p-channel MOSFET. In other examples, the second transistor 216 can be implemented by any suitable switch, such as, a BJT, JFET, etc. The second transistor 216 includes a gate (e.g., a control terminal), a drain (e.g., a current terminal), and a source (e.g., a current terminal). The gate of the second transistor 216 is coupled to the output of the amplifier 212 and the gate of the first transistor 214. The source of the second transistor 216 is coupled to the voltage supply node 222 and the drain of the second transistor 216 is coupled to the second resistor 218 and the fourth terminal 220. The second transistor 216 controls the flow of current between the voltage supply node 222 and the second resistor 218.

In the example of FIG. 2, the second resistor 218 causes a voltage drop between the fourth terminal 220 and the reference voltage node 224 based on the level of current flowing through the second transistor 216. In the illustrated example of FIG. 2, the fourth terminal 220 is a terminal at which a voltage level that reflects the temperature of an integrated circuit die including the second temperature indicator 138 (e.g., the second integrated circuit die 110) can be measured (e.g., an output voltage node). The second temperature sensor 106 includes the voltage supply node 222. The example voltage supply node 222 can receive a supply voltage (e.g., a 5 V direct current (DC) signal). The second temperature sensor 106 further includes the example reference voltage node 224. The example reference voltage node 224 can serve as a reference for voltage measurements in the second temperature sensor 106. In the example of FIG. 2, the reference voltage node 224 receives no voltage and is at a voltage level of zero volts. In other example, the reference voltage node 224 can receive any suitable reference voltage.

In the example illustrated in FIG. 2, the second temperature indicator 138 includes the first terminal 134 of the second integrated circuit die 110, the second terminal 136 of the second integrated circuit die 110, and the third resistor 226. The third resistor 226 is coupled to the first terminal 134 and the second terminal 136. Via the first terminal 134 and the second terminal 136, the third resistor 226 is coupled to the current source 204, the capacitor 206, the inverting terminal of the amplifier 212, and the reference voltage node 224. The resistance of the third resistor 226 varies resistance depending on the temperature of an integrated circuit die including the second temperature indicator 138 (e.g., the second integrated circuit die 110). The current flowing through the third resistor 226 is based on the current generated by the current source 204. Based on the temperature indicated by the second temperature indicator 138 and the current generated by the current source 204, the third resistor 226 causes a voltage drop between the first terminal 134 and the second terminal 136 (e.g., between the first terminal 120 and the second terminal 122). The voltage drop caused by the third resistor 226 is representative of the temperature of an integrated circuit die including the second temperature indicator 138 (e.g., the second integrated circuit die 110).

In the example of FIG. 2, a voltage level representative of the temperature of an integrated circuit die including the second temperature indicator 138 (e.g., the second integrated circuit die 110) can be measured at the fourth terminal 220. The voltage level representative of the temperature of an integrated circuit die including the second temperature indicator 138 (e.g., $V_{TEMPERATURE}$) can be determined based on Equation 1 shown below:

$$V_{TEMPERATURE} = ((I_R * R_{SSC}) - V_{OFFSET}) * \frac{R_{OUT}}{R_{IN}} \quad \text{Equation-1}$$

In Equation 1 above, $I_R$ represents the current flowing through the through the third resistor 226, $R_{SSC}$ represents the resistance of the third resistor 226, $V_{OFFSET}$ represents the voltage level at the third terminal 208, ROUT represents the resistance of the second resistor 218, and $R_{IN}$ represents the resistance of the first resistor 210. As such, the temperature of an integrated circuit die including the second temperature indicator 138 (e.g., the second integrated circuit die 110, a GaN semiconductor, a switch having a channel including GaN, etc.) can be measured accurately. The examples disclosed herein allow for the temperatures sensing of an integrated circuit die including the second temperature indicator 138 (e.g., the second integrated circuit die 110) to be calibrated by adjusting the level of current generated by the current source 204 (e.g., during a testing phase of the second integrated circuit die 110).

Figure 3:
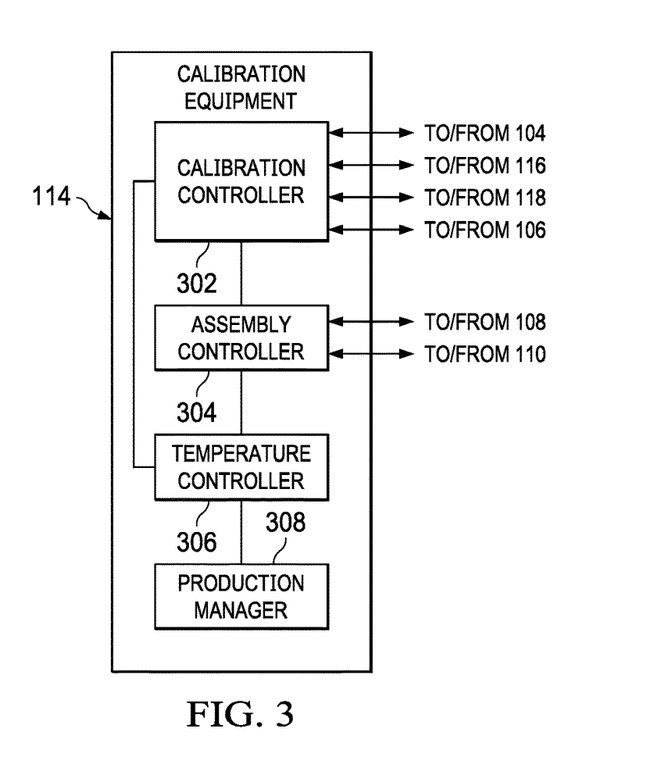
FIG. 3 is a block diagram showing additional detail of the example calibration equipment of FIG. 1.

FIG. 3 is a block diagram showing additional detail of the example calibration equipment 114 of FIG. 1. In the example of FIG. 3, the calibration equipment 114 includes an example calibration controller 302, an example assembly controller 304, an example temperature controller 306, and an example production manager 308. The calibration equipment 114 of FIGS. 1 and/or 3 is configured to perform calibration and/or trimming operations during a testing phase of a multi-chip module (MCM).

In the example of FIG. 3, the calibration controller 302 can be implemented by a voltage source and/or current source. In some examples, the calibration controller 302 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). The calibration controller 302 is coupled to the assembly controller 304, and the temperature controller 306. In the example of FIG. 3, the calibration controller 302 is configured to be coupled to and/or otherwise communicate with the first temperature sensor 104, the second temperature sensor 106, the first calibrator 116, and the second calibrator 118. The calibration controller 302 can be configured to start calibration and/or trimming operations of a temperature sensor in response to an indication that one or more integrated circuit dies are ready for assembly.

In the illustrated example of FIG. 3, the calibration controller 302 is configured to control calibration and/or trimming operations of one or more temperature sensors during the production of MCMs. For example, the calibration controller 302 can calibrate (e.g., trim) the first temperature sensor 104 with the first calibrator 116 to meet a threshold of accuracy when reading a temperature (e.g., voltage and/or resistance values indicative of temperature). In some examples, the temperature can be room temperature (e.g., 73.4° F./23° C.). In additional or alternative examples, the temperature can be an operating temperature of a device including the first integrated circuit die 108 and the second integrated circuit die 110. The calibration controller 302 can calibrate (e.g., trim) the first temperature sensor 104 with the first calibrator 116 until the value at the output of the first temperature sensor 104 (e.g., indicative of the temperature of the first integrated circuit die 108) satisfies a threshold of accuracy. If the value at the output of the first temperature sensor 104 does not satisfy the threshold of accuracy, the calibration controller 302 can continue to calibrate (e.g., trim) the first temperature sensor 104 with the first calibrator 116.

In the example of FIG. 3, if the value at the output of the first temperature sensor 104 satisfies the threshold of accuracy, the calibration controller 302 can conclude calibration (e.g., trimming) of the first temperature sensor 104. The calibration equipment 114 can additionally be configured to calibrate (e.g., trim) the second temperature sensor 106 with the second calibrator 118 until the value at the output of the second temperature sensor 106 (e.g., indicative of the temperature of the second integrated circuit die 110) satisfies a threshold of accuracy. If the value at the output of the second temperature sensor 106 does not satisfy the threshold of accuracy, the calibration equipment 114 can continue to calibrate (e.g., trim) the second temperature sensor 106 with the second calibrator 118. If the value at the output of the second temperature sensor 106 satisfies the threshold of accuracy, the calibration controller 302 can conclude calibration (e.g., trimming) operations of the second temperature sensor 106.

In the example illustrated in FIG. 3, the assembly controller 304 can be implemented by a robotic arm. In some examples, the assembly controller 304 can be implemented by a pick-and-place machine. In additional or alternative examples, the assembly controller 304 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). The assembly controller 304 is coupled to the calibration controller 302 and the temperature controller 306. In the example of FIG. 3, the assembly controller 304 is configured to be coupled to the first integrated circuit die 108 and/or the second integrated circuit die 110. The assembly controller 304 can be configured to assemble a multi-chip module (MCM) (e.g., the MCM 102) including the first integrated circuit die 108 (e.g., a silicon integrated circuit die) and the second integrated circuit die 110 (e.g., a gallium nitride integrated circuit die).

In the example illustrated in FIG. 3, the temperature controller 306 can be implemented by a data acquisition system and/or data acquisition unit. In additional or alternative examples, the temperature controller 306 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). The temperature controller 306 is coupled to the calibration controller 302, the assembly controller 304, and the production manager 308.

In the example of FIG. 3, the temperature controller 306 is configured to determine whether to measure the temperature of the MCM (e.g., the MCM 102). For example, prior to a calibration (e.g., trim) operation, the temperature controller 306 can measure (e.g., is configured to measure, sample, etc.) the temperature of the MCM (e.g., the MCM 102), the first integrated circuit die 108, and/or the second integrated circuit die 110. The temperature controller 306 can measure (e.g., is configured to measure, sample a value indicative of, etc.) the temperature of the first integrated circuit die 108 during the first testing phase (e.g., prior to assembly of the MCM (e.g., the MCM 102)). Additionally, the temperature controller 306 can measure (e.g., is configured to measure, sample a value indicative of) the temperature of the first integrated circuit die 108 after assembly of the MCM (e.g., the MCM 102) to be used as a reference for the calibration controller 302 when calibrating (e.g., trimming) the second temperature sensor 106. Because the second integrated circuit die 110 does not include memory in order provide calibration (e.g., trimming) of a temperature sensor, the temperature controller 306 measures the temperature of the second integrated circuit die 110 via the first temperature sensor 104 after calibrating (e.g., trimming) of the first temperature sensor 104. Such a measurement allows the temperature controller 306 to determine a reference temperature so that the second temperature sensor 106 can be calibrated and/or trimmed. In some examples, the temperature controller 306 can be configured to adjust the temperature of an MCM (e.g., the MCM 102), the first integrated circuit die 108, and/or the second integrated circuit die 110 to facilitate testing at multiple temperatures. Additionally, while the temperature controller 306 can adjust the temperature of an MCM (e.g., the MCM 102), such adjustments are subject to environmental factors (e.g., room temperature, etc.) that can impact the actual temperature achieved by the MCM (e.g., the MCM 102). Thus, the first temperature sensor 104 allows for the temperature controller 306 to assess whether an MCM (e.g., the MCM 102) has achieved a temperature set by the temperature controller 306. Furthermore, once ascertaining that an MCM (e.g., the MCM 102) has achieved a temperature set by the temperature controller 306 and/or ascertaining a temperature of an MCM (e.g., the MCM 102), the calibration controller 302 can calibrate and/or trim the second temperature sensor 106 to a threshold of accuracy.

In the example of FIG. 3, the production manager 308 can be implemented by a transmitter. In additional or alternative examples, the production manager 308 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). The production manager 308 can additionally or alternatively be implemented by any suitable device to forward MCMs (e.g., the MCM 102), the first integrated circuit die 108, and/or the second integrated circuit die 110 to forwards the MCM (e.g., the MCM 102) to a next stage of production. The production manager 308 is coupled to the temperature controller 306. The production manager 308 is configured to forward the MCM (e.g., the MCM 102) to a next stage of production. For example, the next stage of production can include a packaging phase before shipment to end-use sites (e.g., customers, retailers, warehouses, etc.).

Figure 4:
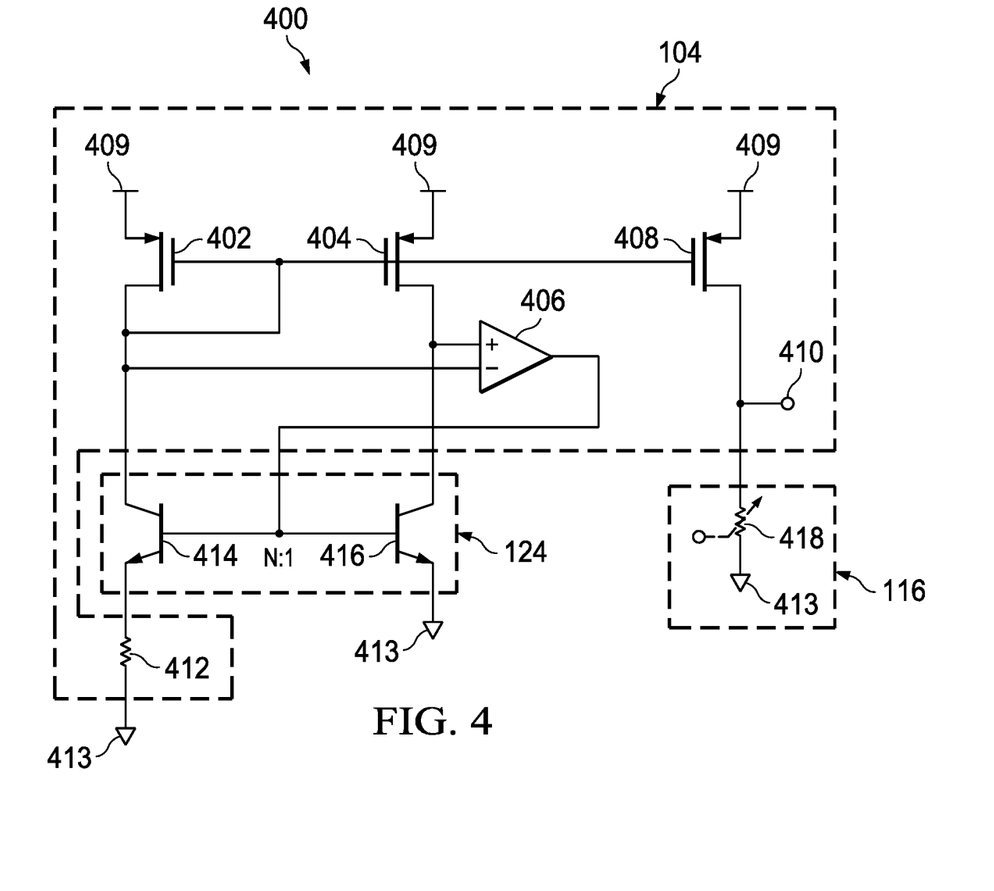
FIG. 4 is a schematic illustration of an example circuit representative of the example first temperature sensor, the example first calibrator, and the example first temperature indicator of FIG. 1.

FIG. 4 is a schematic illustration of an example circuit 400 representative of the example first temperature sensor 104, the example first calibrator 116, and the example first temperature indicator 124 of FIG. 1. In the example of FIG. 4, the first temperature sensor 104 includes a first transistor 402, a second transistor 404, an amplifier 406, a third transistor 408, an input voltage node 409, an output node 410, a resistor 412, and a reference voltage node 413. The first temperature indicator 124 includes a fourth transistor 414 and a fifth transistor 416. The first calibrator 116 includes a variable resistor 418.

In the example of FIG. 4, each of the first transistor 402, the second transistor 404, and the third transistor 408 is a p-channel MOSFET including a gate (e.g., a control terminal), a source (e.g., a current terminal), and a drain (e.g., a current terminal). Each of the fourth transistor 414 and the fifth transistor 416 are negative-positive-negative (NPN) bipolar junction transistors (BJTs) including a base (e.g., a control terminal), a collector (e.g., a current terminal), and an emitter (e.g., a current terminal). The amplifier 406 includes a non-inverting terminal, an inverting terminal, and an output.

In FIG. 4, the source of the first transistor 402 is coupled to the input voltage node 409 and receives an input voltage. The gate of the first transistor 402 is coupled to the drain of the first transistor 402, the gate of the third transistor 408, and the gate of the second transistor 404. The drain of the first transistor 402 is coupled to the gate of the first transistor 402, the inverting input of the amplifier 406, and the collector of the fourth transistor 414. The source of the second transistor 404 is coupled to the input voltage node 409 and receives the input voltage. The gate of the second transistor 404 is coupled to the gate of the first transistor 402, the gate of the third transistor 408, and the drain of the first transistor 402. The drain of the second transistor 404 is coupled to the non-inverting input of the amplifier 406 and the collector of the fifth transistor 416.

In the example of FIG. 4, the amplifier 406 includes the non-inverting terminal, the inverting terminal, and the output. The non-inverting terminal of the amplifier 406 is coupled to the drain of the second transistor 404 and the collector of the fifth transistor 416. The inverting terminal of the amplifier 406 is coupled to the drain of the first transistor 402 and the collector of the fourth transistor 414. The output of the amplifier 406 is coupled to the base of the fourth transistor 414 and the base of the fifth transistor 416.

In the illustrated example of FIG. 4, the source of the third transistor 408 is coupled to the input voltage node 409 and receives the input voltage. The gate of the third transistor 408 is coupled to the drain of the first transistor 402, the gate of the first transistor 402, and the gate of the second transistor 404. The drain of the third transistor 408 is coupled to the output node 410 and the variable resistor 418. The resistor 412 is coupled between the emitter of the fourth transistor 414 and a reference voltage node 413.

In the example of FIG. 4, the base of the fourth transistor 414 is coupled to the base of the fifth transistor 416 and the output of the amplifier 406. The collector of the fourth transistor 414 is coupled to the drain of the first transistor 402, the gate of the first transistor 402, the gate of the second transistor 404, the inverting terminal of the amplifier 406, and the gate of the third transistor 408. The emitter of the fourth transistor 414 is coupled to the resistor 412. The base of the fifth transistor 416 is coupled to the base of the fourth transistor 414 and the output of the amplifier 406. The collector of the fifth transistor 416 is coupled to the drain of the second transistor 404 and the non-inverting terminal of the amplifier 406. The emitter of the fifth transistor 416 is coupled to the reference voltage node 413. In the example of FIG. 1, the emitter of the fourth transistor 414 is physically larger (e.g., by a factor of N) than the emitter of the fifth transistor 416 such that the current flowing through the fifth transistor 416, per unit area, is N times larger than the current flowing through the fourth transistor 414.

In the example of FIG. 4, the variable resistor 418 is coupled between the drain of the output node 410 and the reference voltage node 413. The variable resistor 418 can be calibrated (e.g., is trimmable) and can be adjusted to improve the accuracy of temperature readings of the first integrated circuit die 108. In operation, the difference in current density between the fourth transistor 414 and the fifth transistor 416 produce a difference in the base to emitter voltage ($V_{BE}$) which causes a voltage between the resistor 412 and the reference voltage node 413 and produces a current. A current proportional by a ratio of 1:N to the current flowing through the resistor 412 flows through the variable resistor 418 and causes a voltage drop between the output node 410 and the reference voltage node 413. The difference in the base to emitter voltage ($V_{BE}$) is proportional to temperature, therefore causing a voltage at the output node 410 that is proportional to temperature. The amplifier 406 in combination with the first transistor 402 and the second transistor 404 maintains the base voltage on the fourth transistor 414 and the fifth transistor 416, respectively, such that proportionate currents flow through the fourth transistor 414 and the fifth transistor 416. In some examples, the current flowing through the fourth transistor 414 and the fifth transistor 416 are equal currents. To improve the accuracy of temperature measurements made by the first temperature sensor 104, the variable resistor 418 can be adjusted.

While an example manner of implementing the circuit 200 of FIG. 2 is illustrated in FIG. 2 and an example manner of implementing the calibration equipment 114 of FIG. 1 is illustrated in FIG. 3, one or more of the elements, processes and/or devices illustrated in FIGS. 2 and 3 may be combined, divided, re-arranged, omitted, eliminated and/or implemented in any other way. Further, the example calibration controller 302, the example assembly controller 304, the example temperature controller 306, the example production manager 308, and/or, more generally, the example calibration equipment 114 of FIG. 3, and/or the example current source 204, and/or, more generally, the example second calibrator 118, and/or the example first terminal 120, the example second terminal 122, the example capacitor 206, the example third terminal 208, the example first resistor 210, the example operational amplifier 212, the example first transistor 214, the example second transistor 216, the example second resistor 218, the example fourth terminal 220, the example voltage supply node 222, the example voltage reference node 224, and/or, more generally, the example second temperature sensor 106, and/or the example first terminal 134, the example second terminal 136, the example third resistor 226, and/or, more generally, the example second temperature indicator 138, and/or, more generally, the example circuit 200 of FIG. 2 may be implemented by hardware, software, firmware and/or any combination of hardware, software and/or firmware. Thus, for example, any of the example calibration controller 302, the example assembly controller 304, the example temperature controller 306, the example production manager 308, and/or, more generally, the example calibration equipment 114 of FIG. 3, and/or the example current source 204, and/or, more generally, the example second calibrator 118, and/or the example first terminal 120, the example second terminal 122, the example capacitor 206, the example third terminal 208, the example first resistor 210, the example operational amplifier 212, the example first transistor 214, the example second transistor 216, the example second resistor 218, the example fourth terminal 220, the example voltage supply node 222, the example voltage reference node 224, and/or, more generally, the example second temperature sensor 106, and/or the example first terminal 134, the example second terminal 136, the example third resistor 226, and/or, more generally, the example second temperature indicator 138, and/or, more generally, the example circuit 200 of FIG. 2 could be implemented by one or more analog or digital circuit(s), logic circuits, programmable processor(s), programmable controller(s), graphics processing unit(s) (GPU (s)), digital signal processor(s) (DSP(s)), application specific integrated circuit(s) (ASIC(s)), programmable logic device (s) (PLD(s)) and/or field programmable logic device(s) (FPLD(s)). When reading any of the apparatus or system claims of this patent to cover a purely software and/or firmware implementation, at least one of the example calibration controller 302, the example assembly controller 304, the example temperature controller 306, the example production manager 308, and/or, more generally, the example calibration equipment 114 of FIG. 3, and/or the example current source 204, and/or, more generally, the example second calibrator 118, and/or the example first terminal 120, the example second terminal 122, the example capacitor 206, the example third terminal 208, the example first resistor 210, the example operational amplifier 212, the example first transistor 214, the example second transistor 216, the example second resistor 218, the example fourth terminal 220, the example voltage supply node 222, the example voltage reference node 224, and/or, more generally, the example second temperature sensor 106, and/or the example first terminal 134, the example second terminal 136, the example third resistor 226, and/or, more generally, the example second temperature indicator 138, and/or, more generally, the example circuit 200 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example circuit 200 of FIG. 2 and/or the example calibration equipment 114 of FIG. 3 may include one or more elements, processes and/or devices in addition to, or instead of, those illustrated in FIGS. 2 and/or 3 and/or may include more than one of any or all of the illustrated elements, processes and devices. As used herein, the phrase in communication, including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5:
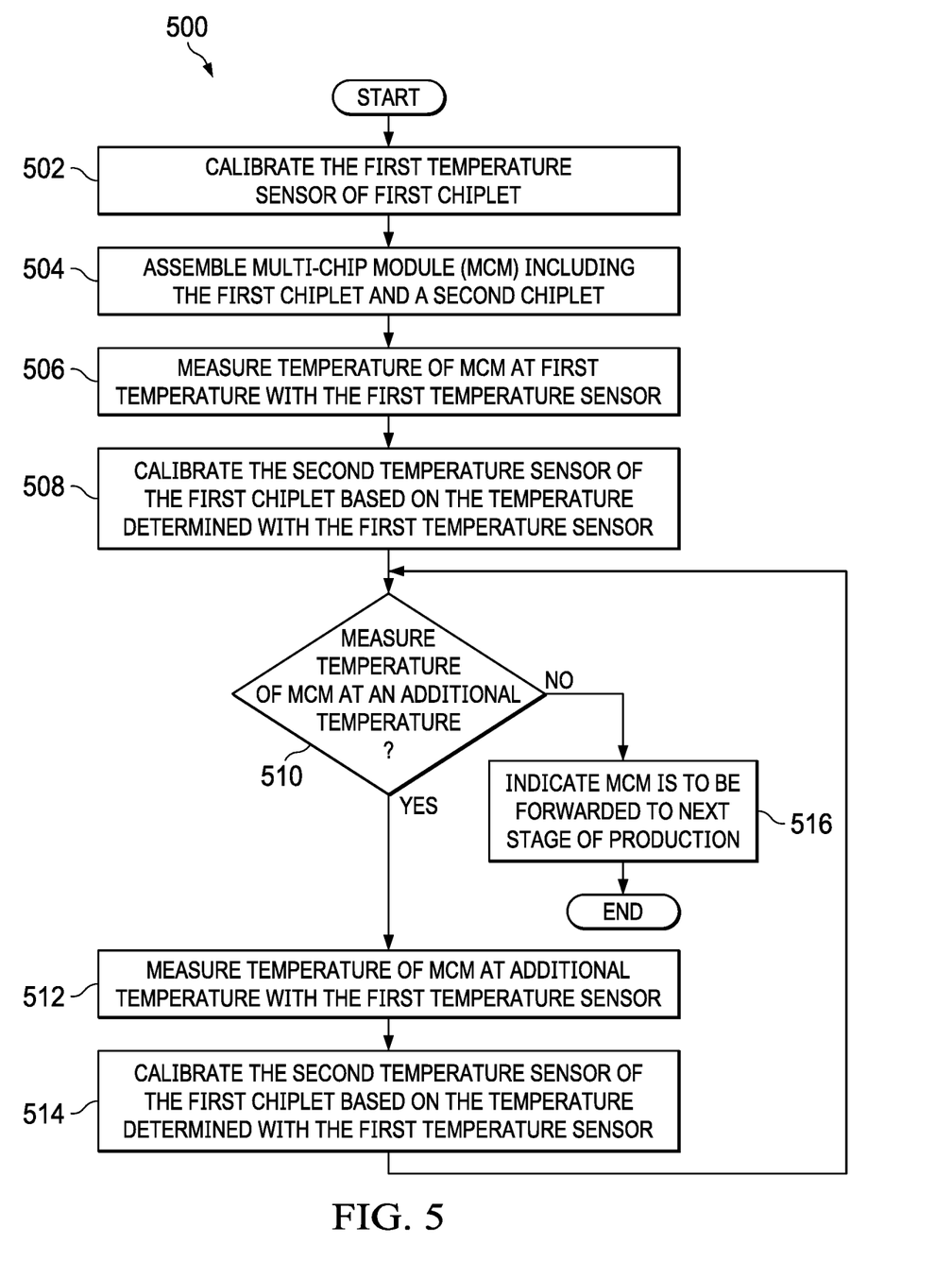
FIG. 5 is a flowchart representative of a process, that may be implemented by example machine readable instructions which may be executed to implement the calibration equipment of FIGS. 1 and 3 to perform calibration and/or trimming operations during a testing phase of a multi-chip module.

A flowchart representative of example hardware logic, machine readable instructions, hardware implemented state machines, and/or any combination thereof for implementing the calibration equipment 114 of FIG. 3 is shown in FIG. 5. The machine-readable instructions may be one or more executable program(s) or portion(s) of one or more executable program(s) for execution by a computer processor such as a processor and/or a processor platform. The program(s) may be embodied in software stored on a non-transitory computer readable storage medium such as a CD-ROM, a floppy disk, a hard drive, a DVD, a Blu-ray disk, or a memory associated with the processor, but the entire program(s) and/or parts thereof could alternatively be executed by a device other than the processor and/or embodied in firmware or dedicated hardware. Further, although the example program(s) is/are described with reference to the flowchart illustrated in FIG. 5, many other methods of implementing the example calibration equipment 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a field programmable gate array (FPGA), an ASIC, a comparator, an operational-amplifier (op-amp), a logic circuit, etc.) structured to perform the corresponding operation without executing software or firmware.

Figure 6:
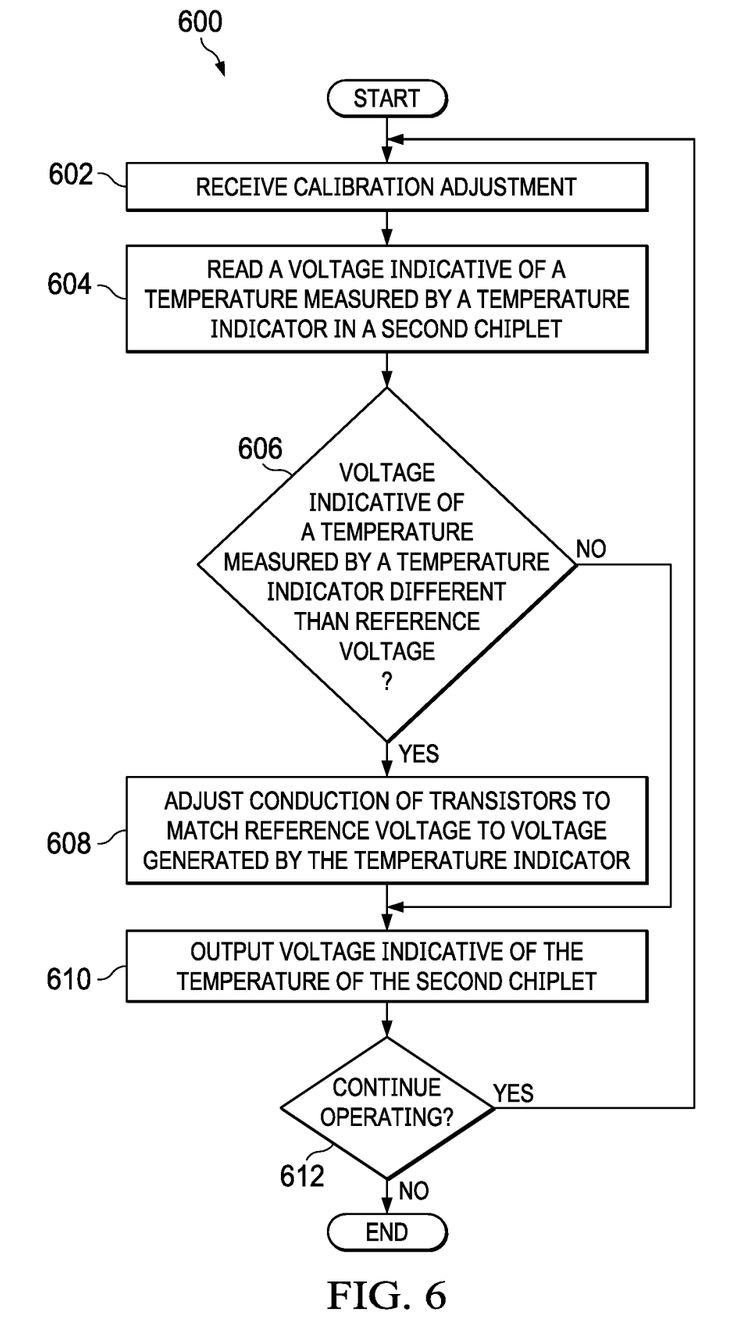
FIG. 6 is a flowchart representative of a process, that may be implemented by example machine readable instructions which may be executed to implement the first integrated circuit die of FIG. 1 and/or the circuit of FIG. 2.

A flowchart representative of example hardware logic, machine readable instructions, hardware implemented state machines, and/or any combination thereof for implementing the first integrated circuit die 108 of FIG. 1 and/or the circuit 200 of FIG. 2 is shown in FIG. 6. The machine-readable instructions may be one or more executable program(s) or portion(s) of one or more executable program(s) for execution by a computer processor such as a processor and/or a processor platform. The program(s) may be embodied in software stored on a non-transitory computer readable storage medium such as a CD-ROM, a floppy disk, a hard drive, a DVD, a Blu-ray disk, or a memory associated with the processor, but the entire program(s) and/or parts thereof could alternatively be executed by a device other than the processor and/or embodied in firmware or dedicated hardware. Further, although the example program(s) is/are described with reference to the flowchart illustrated in FIG. 6, many other methods of implementing the first integrated circuit die 108 of FIG. 1 and/or the circuit 200 of FIG. 2 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine-readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be used to create, manufacture, and/or produce machine executable instructions. For example, the machine-readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, the disclosed machine-readable instructions and/or corresponding program(s) are intended to encompass such machine-readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 4 and 5 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

Including and comprising (and all forms and tenses thereof) are used herein to be open ended terms. Thus, whenever a claim employs any form of include or comprise (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase at least is used as the transition term in, for example, a preamble of a claim, it is open-ended in the same manner as the term comprising and including are open ended. The term and/or when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase at least one of A and B is intended to refer to implementations including any of (1) at least one A, (2) at least one B, and (3) at least one A and at least one B. Similarly, as used herein in the context of describing structures, components, items, objects and/or things, the phrase at least one of A or B is intended to refer to implementations including any of (1) at least one A, (2) at least one B, and (3) at least one A and at least one B. As used herein in the context of describing the performance or execution of processes, instructions, actions, activities and/or steps, the phrase at least one of A and B is intended to refer to implementations including any of (1) at least one A, (2) at least one B, and (3) at least one A and at least one B. Similarly, as used herein in the context of describing the performance or execution of processes, instructions, actions, activities and/or steps, the phrase at least one of A or B is intended to refer to implementations including any of (1) at least one A, (2) at least one B, and (3) at least one A and at least one B.

As used herein, singular references (e.g., a, an, first, second, etc.) do not exclude a plurality. The term a or an entity, as used herein, refers to one or more of that entity. The terms a (or an), one or more, and at least one can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 5 is a flowchart representative of a process 500, that may be implemented by example machine readable instructions which may be executed to implement the calibration equipment 114 of FIGS. 1 and 3 to perform calibration and/or trimming operations during a testing phase of a multi-chip module. The process 500 begins at block 502 where the calibration controller 302, and/or, more generally, the calibration equipment 114 calibrates (e.g., trims) the first temperature sensor 104 with the first calibrator 116 to meet a threshold of accuracy when reading a first temperature (e.g., sample a value indicative of temperature). For example, the first temperature can be room temperature (e.g., 73.4° F./23° C.). The calibration controller 302 can calibrate (e.g., trim) the first temperature sensor 104 with the first calibrator 116 until the value at the output of the first temperature sensor 104 (e.g., indicative of the temperature of the first integrated circuit die 108) satisfies a threshold of accuracy. If the value at the output of the first temperature sensor 104 does not satisfy the threshold of accuracy, the calibration controller 302 can continue to calibrate (e.g., trim) the first temperature sensor 104 with the first calibrator 116.

In the example of FIG. 5, if the value at the output of the first temperature sensor 104 satisfies the threshold of accuracy, the process 500 proceeds to block 504 where the assembly controller 304, and/or, more generally, the calibration equipment 114 assembles a multi-chip module (MCM) (e.g., the MCM 102) including the first integrated circuit die 108 (e.g., a silicon integrated circuit die) and the second integrated circuit die 110 (e.g., a gallium nitride integrated circuit die). At block 506, the temperature controller 306, and/or, more generally, the calibration equipment 114 can measure (e.g., is configured to measure) the temperature of the MCM (e.g., the MCM 102) at a first temperature using the first temperature sensor 104. For example, the first temperature can be room temperature (e.g., 73.4° F./23° C.) (e.g., sampled at room temperature). At block 508, the calibration controller 302, and/or, more generally, the calibration equipment 114 can calibrate (e.g., trim) the second temperature sensor 106 with the second calibrator 118 until the value at the output of the second temperature sensor 106 (e.g., indicative of the temperature of the second integrated circuit die 110, indicative of the temperature of a switch having a channel including gallium nitride, etc.) satisfies a threshold of accuracy. If the value at the output of the second temperature sensor 106 does not satisfy the threshold of accuracy, the calibration controller 302 can continue to calibrate (e.g., trim) the second temperature sensor 106 with the second calibrator 118.

In the example of FIG. 5, if the value at the output of the second temperature sensor 106 satisfies the threshold of accuracy, the process 500 proceeds to block 510 where the temperature controller 306, and/or, more generally, the calibration equipment 114 determines whether to measure the temperature of the MCM (e.g., the MCM 102) at an additional temperature (e.g., whether to take an additional temperature measurement, whether to sample a value indicative of temperature, etc.). For example, an additional temperature can be a temperature greater than the first temperature at which the second temperature sensor 106 was tested at block 508. In some examples, an additional temperature can correspond to a temperature at operating condition of a device including the first integrated circuit die 108 and/or the second integrated circuit die 110. If the temperature controller 306 determines not to measure the temperature of the MCM (e.g., the MCM 102) at an additional temperature (block 510: NO), the process 500 proceeds to block 516. If the temperature controller 306 determines to measure the temperature of the MCM (e.g., the MCM 102) at an additional temperature (block 510: YES), the process 500 proceeds to block 512 where the temperature controller 306, and/or, more generally, the calibration equipment 114 measures (e.g., is configured to measure, sample a value indicative of, etc.) the temperature of the MCM (e.g., the MCM 102) at an additional temperature using the first temperature sensor 104. For example, an additional temperature can be an operating temperature of a device including the first integrated circuit die 108 and the second integrated circuit die 110. At block 514, the calibration controller 302, and/or, more generally, the calibration equipment 114 can calibrate (e.g., trim) the second temperature sensor 106 with the second calibrator 118 until the value at the output of the second temperature sensor 106 (e.g., indicative of the temperature of the second integrated circuit die 110) satisfies a threshold of accuracy. If the value at the output of the second temperature sensor 106 does not satisfy the threshold of accuracy, the calibration controller 302 can continue to calibrate (e.g., trim) the second temperature sensor 106 with the second calibrator 118.

In the example of FIG. 5, if the value at the output of the second temperature sensor 106 satisfies the threshold of accuracy, the process 500 proceeds to block 510 where the temperature controller 306, and/or, more generally, the calibration equipment 114 determines whether there are additional temperatures at which to measure the second temperature sensor 106. Returning to block 510, if the temperature controller 306 determines not to measure the temperature of the MCM at an additional temperature (block 510: NO), the process 500 proceeds to block 516. At block 516, the production manager 308, and/or, more generally, the calibration equipment 114 indicates that the MCM (e.g., the MCM 102) is to be forwarded to a next stage of production. For example, the next stage of production can include a packaging phase before shipment to end-use sites (e.g., customers, retailers, warehouses, etc.). After block 516, the process 500 terminates.

FIG. 6 is a flowchart representative of a process 600, that may be implemented by example machine readable instructions which may be executed to implement the first integrated circuit die 108 of FIG. 1 and/or the circuit 200 of FIG. 2. The process 600 begins at block 602 the second calibrator 118 and/or the current source 204 receives a calibration (e.g., a trim) adjustment. For example, the second calibrator 118 can receive a calibration adjustment from the calibration equipment 114. Additionally or alternatively, the current source 204 can receive a calibration adjustment from a remote device (e.g., the calibration equipment 114). At block 604, the second temperature sensor 106 and/or the amplifier 212 reads a voltage indicative of a temperature measured by a temperature indicator (e.g., the second temperature indicator 138 and/or the third resistor 226) in a second integrated circuit die (e.g., the second integrated circuit die 110).

In the example of FIG. 6, at block 606, the second temperature sensor 106 and/or the amplifier 212 determines whether the voltage indicative of a temperature measured by the temperature indicator (e.g., the second temperature indicator 138 and/or the third resistor 226) is different than a reference voltage. If the second temperature sensor 106 and/or the amplifier 212 determines that the voltage indicative of a temperature measured by the temperature indicator (e.g., the second temperature indicator 138 and/or the third resistor 226) is different than a reference voltage (block 606: YES), the process 600 proceeds to block 608. If the second temperature sensor 106 and/or the amplifier 212 determines that the voltage indicative of a temperature measured by the temperature indicator (e.g., the second temperature indicator 138 and/or the third resistor 226) is not different than a reference voltage (block 606: NO), the process 600 proceeds to block 610.

In the illustrated example of FIG. 6, at block 608, the second temperature sensor 106 and/or the amplifier 212 adjusts the conduction of transistors to match the reference voltage to the voltage indicative of a temperature measured (e.g., the first transistor 214 and/or the second transistor 216) by the temperature indicator (e.g., the second temperature indicator 138 and/or the third resistor 226). At block 610, the second temperature sensor 106 outputs a voltage indicative of the temperature of the second integrated circuit die (e.g., the second integrated circuit die 110). For example, the second temperature sensor 106 outputs a voltage indicative of the temperature of an integrated circuit die including the second temperature indicator 138 (e.g., the second integrated circuit die 110) at the fourth terminal 220.

In the example of FIG. 6, at block 612, the second temperature sensor 106 determines whether to continue operating. For example, a condition that may cause the second temperature sensor 106 to determine to not continue operating can include loss of power. If the second temperature sensor 106 determines to continue operating (block 612: YES), the process 600 continues to block 602. If the second temperature sensor 106 determines not to continue operating (block 612: NO), the process 600 terminates.

From the foregoing, it will be appreciated that example methods, apparatus and articles of manufacture have been disclosed that improve the monitoring of temperature in GaN integrated circuit dies of multichip modules. Examples disclosed herein allow for a temperature sensor to be coupled to an integrated circuit die that does not have the properties to allow a temperature sensor on the integrated circuit die. Examples disclosed herein improve the accuracy of temperature sensors on MCMs including GaN integrated circuit dies. The disclosed methods, apparatus and articles of manufacture improve the efficiency of using a computing device by providing accurate temperature measurements to reduce power loss due to heat and/or malfunction due to excessive temperature outside of a devices operating area. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
 a first die including:
  a first transistor having a first channel including a first material; and
  a temperature coefficient resistor having a first terminal and a second terminal, the temperature coefficient resistor including a resistance dependent on a temperature of the first die;
 a second die including:
  a second transistor having a second channel including a second material;
  a variable current source including an output, a first input adapted to be coupled to an adjustment device, and a second input coupled to a voltage supply node;
  a first temperature sensor configured to measure a value indicative of a temperature of the second die; and
  a second temperature sensor including:
   a reference voltage coupled to the second terminal of the temperature coefficient resistor;
   an amplifier including an output and including a first input coupled to the output of the variable current source and the first terminal of the temperature coefficient resistor; and
   a third transistor including a first current terminal coupled to the voltage supply, a second current terminal coupled to an output voltage, and a control terminal coupled to the output of the amplifier; and
 a package including the first die and the second die.

2. The apparatus of claim 1, wherein the first material includes gallium nitride and the second material includes silicon.

3. The apparatus of claim 1, wherein the value indicative of the temperature of the second transistor is based on a current value that is dependent on the temperature of the second die.

4. The apparatus of claim 1, wherein the first input of the amplifier is an inverting input, the amplifier further includes a non-inverting input, the temperature coefficient resistor is a first resistor, and the second die further includes:
 a second resistor coupled between the non-inverting input of the amplifier and an offset voltage; and
 a fourth transistor including a first current terminal coupled to the voltage supply, a second current terminal coupled to the second resistor and the non-inverting input of the amplifier, and a control terminal coupled to the output of the amplifier and the control terminal of the third transistor.

5. The apparatus of claim 1, wherein the temperature coefficient resistor is a first resistor, the second die further including a second resistor coupled between the output voltage and the reference voltage.

6. The apparatus of claim 1, wherein the second die further includes a capacitor coupled between the first input of the amplifier and the reference voltage.

7. The apparatus of claim 1, wherein the third transistor includes a positive-channel metal-oxide-semiconductor field-effect transistor.

* * * * *